(12) United States Patent
Mifune et al.

(10) Patent No.: US 12,316,308 B2
(45) Date of Patent: May 27, 2025

(54) LOAD DRIVING DEVICE AND DIAGNOSTIC METHOD FOR LOAD DRIVING DEVICE

(71) Applicant: Hitachi Astemo, Ltd., Hitachinaka (JP)

(72) Inventors: Yuta Mifune, Hitachinaka (JP); Koichi Tsukio, Hitachinaka (JP)

(73) Assignee: HITACHI ASTEMO, LTD., Hitachinaka (JP)

( * ) Notice: Subject to any disclaimer, the term of this patent is extended or adjusted under 35 U.S.C. 154(b) by 0 days.

(21) Appl. No.: 18/031,173

(22) PCT Filed: Sep. 9, 2021

(86) PCT No.: PCT/JP2021/033193
§ 371 (c)(1),
(2) Date: Apr. 11, 2023

(87) PCT Pub. No.: WO2022/113471
PCT Pub. Date: Jun. 2, 2022

(65) Prior Publication Data
US 2023/0387907 A1    Nov. 30, 2023

(30) Foreign Application Priority Data

Nov. 26, 2020 (JP) ................................ 2020-196090

(51) Int. Cl.
*H03K 17/16* (2006.01)
*H03K 17/687* (2006.01)
(52) U.S. Cl.
CPC ......... *H03K 17/162* (2013.01); *H03K 17/687* (2013.01); *H03K 2217/0072* (2013.01)

(58) Field of Classification Search
CPC ............... H03K 17/162; H03K 17/687; H03K 2217/0072; H03K 17/08142;
(Continued)

(56) References Cited

U.S. PATENT DOCUMENTS

| 2012/0139467 A1* | 6/2012 | Suzuki ................... H02P 29/64 323/284 |
| 2021/0218360 A1 | 7/2021 | Ohara et al. |
| 2022/0049669 A1 | 2/2022 | Arafune et al. |

FOREIGN PATENT DOCUMENTS

| JP | 2019-085925 A | 6/2019 |
| JP | 2019-132633 A | 8/2019 |

(Continued)

OTHER PUBLICATIONS

International Search Report, PCT/JP2021/033193, Nov. 16, 2021, 2 pgs.

*Primary Examiner* — Jung Kim
(74) *Attorney, Agent, or Firm* — Volpe Koenig

(57) ABSTRACT

A high-performance and highly reliable load driving device is provided that can quickly charge an ESD protection capacitor even at the time of load disconnection and complete all diagnoses of the driving system driver within a required time in a load driving device including a diagnosis circuit of a driving system driver and an ESD protection capacitor. A load driving device includes a load; a first switch element connected to the load and configured to control driving of the load; an ESD protection capacitor connected between the load and the first switch element; a charging circuit connected between the load and the first switch element and configured to charge the ESD protection capacitor; and a second switch element connected between the ESD protection capacitor and the charging circuit.

10 Claims, 7 Drawing Sheets

(58) Field of Classification Search
CPC .. H03K 17/163; H03K 17/165; H03K 17/166; H03K 17/167; H03K 17/0814; H03K 17/082; F02D 41/06; G01R 19/165; H02M 1/00
See application file for complete search history.

(56) References Cited

FOREIGN PATENT DOCUMENTS

WO     WO-2019220716 A1 * 11/2019 ............ B60W 20/50
WO        2020/183934 A1    9/2020

* cited by examiner

LOAD DRIVING DEVICE AND DIAGNOSTIC METHOD FOR LOAD DRIVING DEVICE

TECHNICAL FIELD

The present invention relates to a configuration of a load driving device and control thereof, and in particular, relates to a technique effective for application to a load driving device including an ESD protection capacitor.

BACKGROUND ART

When unintended runaway occurs in the vehicle, the driving system driver such as the injector, the idling grid relay, and the electronic throttle needs to be forcibly stopped by a driver stop mechanism in order to prevent a serious accident. In addition, in order to reliably stop the driving system at the time of vehicle runaway, whether the driver stop mechanism can normally operate is diagnosed before start of cranking from turning ON the vehicle key, and the engine start is stopped when the driver stop function is abnormal.

In the diagnosis of the driver stop mechanism, the output voltage of the load drive circuit when the driver stop mechanism permits and prohibits driving is monitored by an arithmetic device or the like. However, when the load is disconnected, it takes time to charge the ESD protection capacitor provided at the output terminal of the load drive circuit, and the output voltage of the load drive circuit is blunted, so that a problem that the diagnosis is not completed within the time from turning ON the vehicle key to the start of cranking arises. Therefore, it is necessary to quickly charge the ESD protection capacitor in order to complete the diagnosis before the start of cranking from turning ON the vehicle key even at the time of load disconnection.

Since diagnosis can be performed even at the time of load disconnection, the engine can be started using a load other than the load disconnected load. For example, even if one cylinder of the injectors of the four-cylinder engine is disconnected, the engine can be started using the injectors of the remaining cylinders, and the vehicle can be moved to a safe place.

As a background art using the action on the ESD protection capacitor, for example, there is a technology such as PTL 1. A fuel injection control device according to PTL 1 includes an electrostatic protection capacitor and a constant current energization unit between an injector downstream side terminal and an injector driving downstream side switch, and a technique is known in which the constant current energization unit causes a constant current to flow from the injector downstream side terminal to GND after the driving current flowing through the injector has completely decreased, thereby allowing a voltage change occurring at a valve closing timing of the injector to be easily detected.

As another background art, a load driving device in PTL 2 includes a load, a synchronous rectifier circuit that drives the load, a voltage monitor circuit that monitors an output terminal voltage of the synchronous rectifier circuit, and a surge protection capacitor and a diagnostic current generation circuit between an output terminal of the synchronous rectifier circuit and the load, and a technique is known in which the output terminal voltage of the synchronous rectifier circuit is controlled to a constant value at the time of disconnection by charging and discharging the surge protection capacitor by the diagnostic current generation circuit, so that the monitor circuit detects the disconnection.

CITATION LIST

Patent Literature

PTL 1: JP 2019-85925 A
PTL 2: WO 2019/220716

SUMMARY OF INVENTION

Technical Problem

However, PTL 1 described above has a configuration in which charges accumulated in the ESD protection capacitor are drawn out in order to easily detect a voltage change occurring at the injector valve closing timing, and charging of the ESD protection capacitor is not considered.

In addition, in PTL 2 described above, the ESD protection capacitor is charged from the current source and the output terminal voltage is controlled to a constant value in order to detect disconnection of the load, and the purpose is not the abnormality diagnosis of the driver stop mechanism.

Therefore, an object of the present invention is to provide a high-performance and highly reliable load driving device and a diagnostic method therefor capable of quickly charging an ESD protection capacitor even at the time of load disconnection and completing all diagnoses of the driving system driver within a required time in a load driving device including a diagnosis circuit of a driving system driver and an ESD protection capacitor.

Solution to Problem

In order to solve the above problems, the present invention includes: a load; a first switch element connected to the load and configured to control driving of the load; an ESD protection capacitor connected between the load and the first switch element; a charging circuit connected between the load and the first switch element and configured to charge the ESD protection capacitor; and a second switch element connected between the ESD protection capacitor and the charging circuit.

Furthermore, the present invention is characterized by including the steps of: (a) energizing a charging circuit switch simultaneously with a start of diagnosis of a load driving driver stop function; (b) charging an ESD protection capacitor from the charging circuit after the load driving driver is switched from energization to non-energization after the step (a), and diagnosing the load driving driver stop function; and (c) non-energizing the charging circuit switch after the step (b), and after the diagnosis of the load driving driver stop function is finished.

Advantageous Effects of Invention

According to the present invention, a high-performance and highly reliable load driving device and a diagnostic method therefor capable of quickly charging the ESD protection capacitor even at the time of load disconnection and completing all diagnoses of the driving system driver within a required time, in the load driving device including a diagnosis circuit of a driving system driver and an ESD protection capacitor can be realized.

Thus, the diagnosis of the driver stop function can be determined in a short time even at the time of load disconnection, so that the abnormality diagnosis of the driver stop function can be completed without extending the time from turning ON the key to the start of engine (start of cranking).

Problems, configurations, and effects other than those described above will be clarified by the description of the following embodiments.

DESCRIPTION OF EMBODIMENTS

Figure 1:
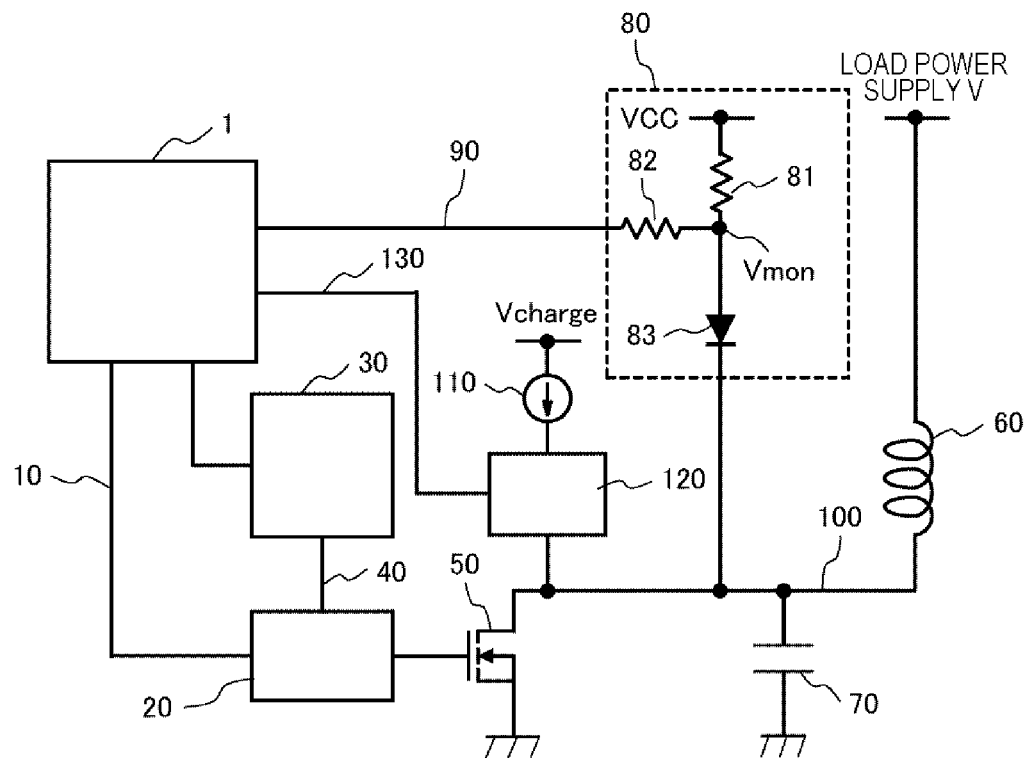
FIG. 1 is a block diagram illustrating a circuit configuration of a load driving device according to a first example of the present invention.

Hereinafter, embodiments of the present invention will be described with reference to the drawings. In the drawings, the same components are denoted by the same reference numerals, and the detailed description of redundant components will be omitted.

First Example

Figure 2:
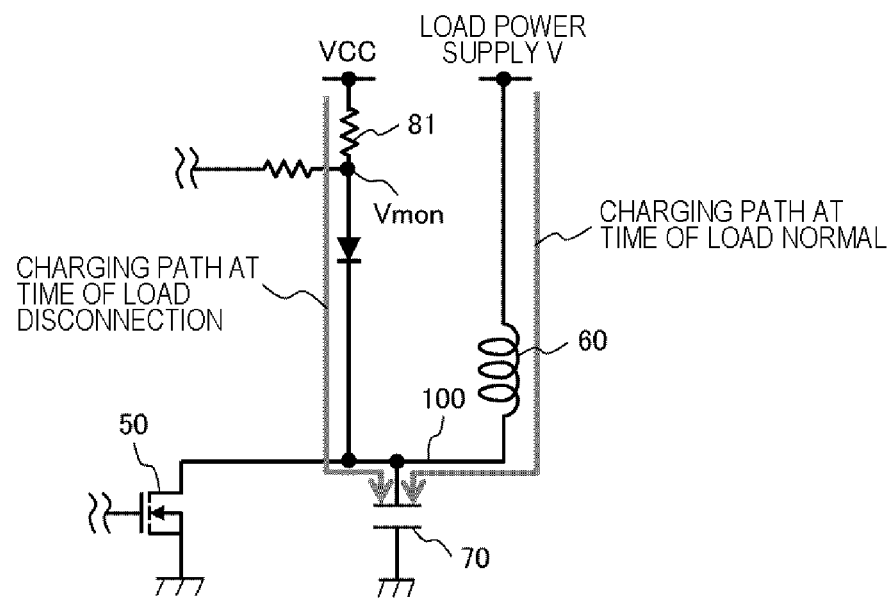
FIG. 2 is a diagram illustrating a capacitor charging path of a conventional load driving device.

With reference to FIGS. 1 to 7 and 11, a load driving device and a diagnostic method thereof according to a first example of the present invention will be described. FIG. 2 is a diagram illustrating a capacitor charging path of a conventional load driving device illustrated as a comparative example for easy understanding of the present invention.

FIG. 1 illustrates a circuit configuration of a load driving device according to the present example. As illustrated in FIG. 1, the load driving device of the present example includes a low side driver 50 for driving a load (inductive load) 60, a terminal capacitor 70 for protecting the load driving device from an electro-static discharge/surge (ESD), a voltage monitor circuit 80 for converting a voltage of an output terminal 100 into a voltage readable by an arithmetic device 1, a charging circuit 110 and a charging circuit switch 120 for charging the terminal capacitor 70, and the arithmetic device 1 for outputting energization timings of the low side driver 50 and the charging circuit switch 120 and monitoring an output voltage of the voltage monitor circuit 80.

A driver control circuit 20 is connected to the arithmetic device 1 by a driver drive signal line 10, and is connected to a driver stop mechanism 30 by a driver stop signal line 40. While the driver stop mechanism 30 outputs the drive permission signal to the driver control circuit 20, the drive signal is output from the arithmetic device 1 to the driver control circuit 20, so that the driver control circuit 20 outputs voltage of energization and non-energization to the gate of the low side driver 50.

In addition, while the driver stop mechanism 30 outputs the drive prohibiting signal to the driver control circuit 20, even if the arithmetic device 1 outputs the drive signal to the driver control circuit 20, the gate signal output from the driver control circuit 20 to the low side driver 50 is inhibited, and the low side driver 50 maintains the non-energized state.

The driver stop mechanism 30 is connected to the arithmetic device 1, and outputs a signal notifying abnormality to the driver stop mechanism 30 when the arithmetic device 1 detects the abnormality. Then, the driver stop mechanism 30 outputs a drive prohibiting signal to the driver control circuit 20. In addition, the driver stop mechanism 30 monitors the arithmetic device 1, and also outputs a drive prohibiting signal to the driver control circuit 20 when an abnormality of the arithmetic device 1 is detected.

The voltage monitor circuit 80 inputs a voltage at a voltage level readable by the arithmetic device 1 to the arithmetic device 1 instead of the voltage of the output terminal 100. A current limiting resistor 81, which is an internal component of the voltage monitor circuit 80, has a role of protecting the low side driver 50 from overcurrent so that the low side driver 50 does not fail due to current flowing from the VCC when the low side driver is energized.

In addition, a current limiting resistor 82 has a role of protecting the input terminal of the arithmetic device 1 by limiting the current flowing into the arithmetic device 1 via a voltage monitor signal line 90. In addition, a protection diode 83 has an anode side connected to the current limiting resistor 81 and a cathode side connected to the output terminal 100 side, and plays a role of preventing a current from flowing back from the load power supply V to the inside of the voltage monitor circuit 80.

When the low side driver 50 is conducted, current flows from the VCC to the GND through the current limiting resistor 81, the protection diode 83, and the drain-source of the low side driver 50, and thus a voltage of about GND potential is input to the arithmetic device 1.

In addition, when the low side driver 50 is non-conducted, VCC<load power supply V is realized, and thus the Vcc voltage is input to the arithmetic device 1 due to the backflow prevention effect of the protection diode 83. In the present example, the arithmetic device 1 detects the driving of the low side driver 30 by detecting a voltage variation when the input voltage from the voltage monitor signal line 90 changes from a predetermined high level voltage to a predetermined low level voltage.

The charging circuit 110 is a constant current source that charges the terminal capacitor 70 via the charging circuit switch 120 immediately after the low side driver 50 is non-energized from being energized, and the voltage of the output terminal 100 can be quickly determined even when the load 60 is disconnected by such a charging. The output current of the charging circuit 110 is set to about 1/1000 or less of the load driving current so as not to affect the operation of the load 60.

As a result, the voltage drop at the load 60 can be sufficiently reduced even when the load 60 is normally connected.

Here, a technical background in which the charging circuit 110 can charge the terminal capacitor 70 in a shorter time than the diagnosis time will be described. FIG. 2 illustrates a charging path of the terminal capacitor 70 when load 60 is normal and disconnected in the conventional load driving device without the charging circuit 110. When the load 60 is in a normal state, a current for charging the terminal capacitor 70 from the load power supply V via the load 60 is mainly used. Since the resistance value RL of the load 60 is several Ω to several tens C), the time constant TL (=RL×C) (T: tau) of the system is small, and charging is performed in a relatively short time.

On the other hand, when the load (inductive load) 60 is in a disconnected state, it is mainly charged from the VCC inside the voltage monitor circuit 80 via the current limiting resistor 81. Since the current limiting resistor 81 does not affect the driving of the load 60, the resistance value R81 is a relatively large value of several kΩ to several hundred kΩ. As a result, the time constant TR81 (=R81×C) of the system becomes large as compared with TL (T: tau), and it takes time to charge the terminal capacitor 70.

Figure 3:
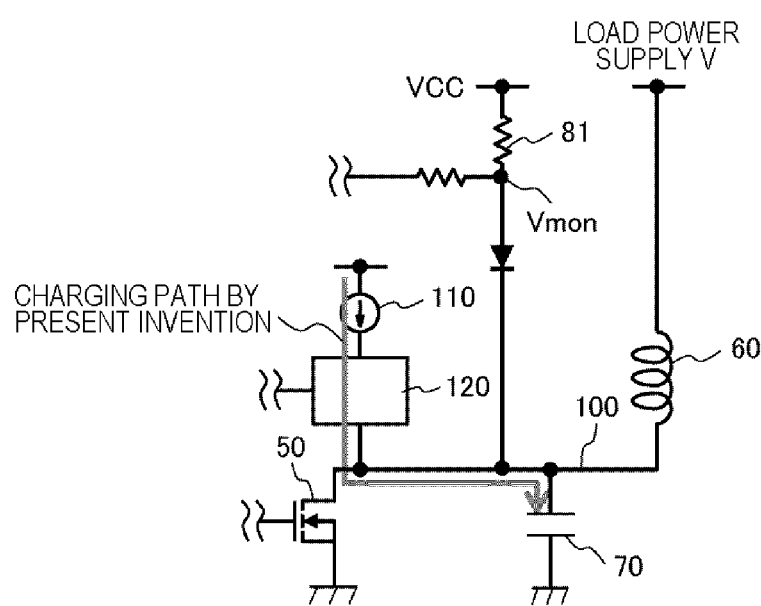
FIG. 3 is a diagram illustrating a capacitor charging path of the load driving device according to the first example of the present invention.

FIG. 3 illustrates a charging path of the terminal capacitor (ESD protection capacitor) 70 at the time of load disconnection in the present invention. By providing the charging circuit 110 and the charging circuit switch 120 (on-resistance: Rsw), a system of a time constant Tsw (=Rsw×C)≈TL (T: tau) that is not affected by the current limiting resistor 81 is obtained, and charging can be completed in a shorter time than the diagnosis time.

Figure 4:
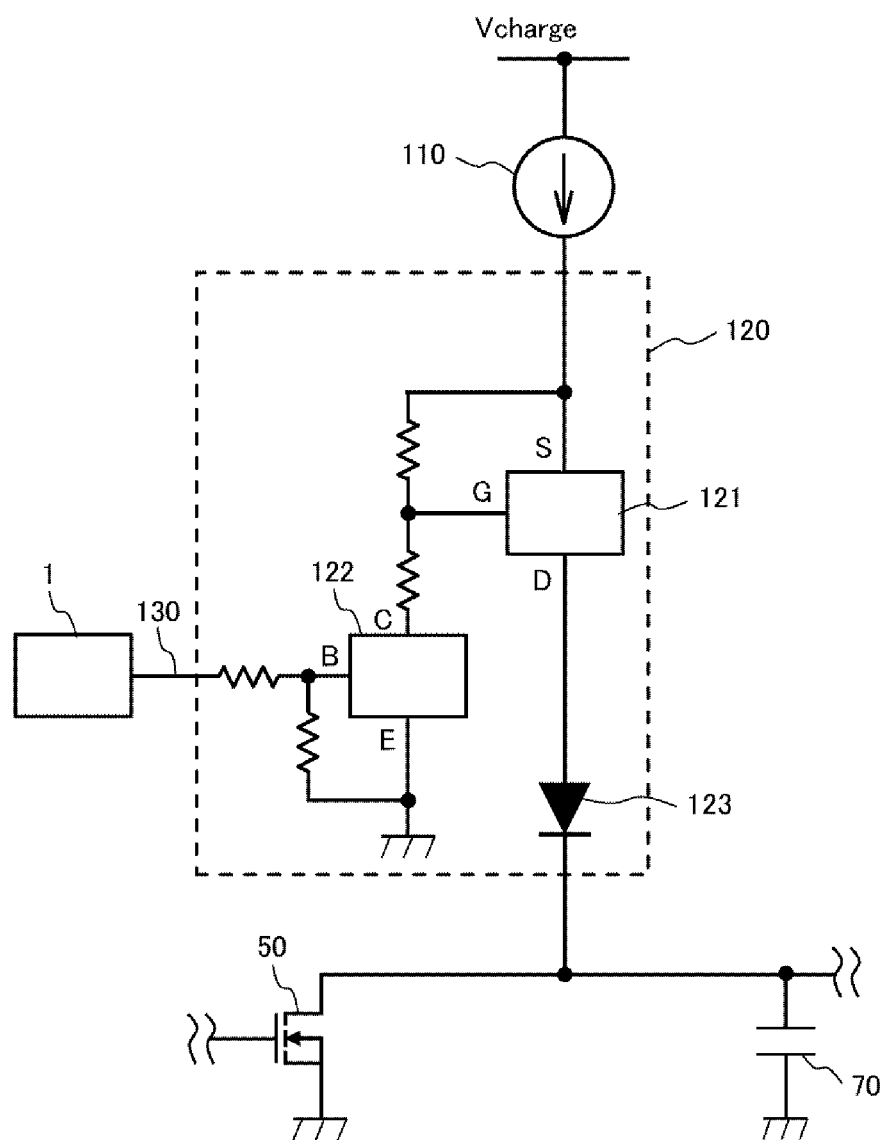
FIG. 4 is a block diagram showing a circuit configuration of a charging circuit switch 120 of FIG. 1.

FIG. 4 illustrates an internal configuration example of the charging circuit switch 120. Since the gate (G) and the source (S) of the Pch-FET 121, which is a component of the charging circuit switch 120, are connected through a resistor, the Pch-FET 121 is non-energized unless the arithmetic device 1 controls an NPN transistor 122 via the charging circuit switch control signal line 130.

In the present internal configuration example, the gate (G) and the source (S) of the Pch-FET 121 are connected through a resistor, but it is also conceivable to provide a protection element in parallel with the resistor for the purpose of protecting the Pch-FET 121. When the charging circuit switch control signal 130 is output by the arithmetic device 1, current is injected into the base (B) of the NPN transistor 122, and the emitter (E) and the collector (C) of the NPN transistor 122 are energized. This energization causes the gate voltage of the Pch-FET 121 to become a voltage lower than the source voltage, and thus the Pch-FET 121 is also energized. On the other hand, when the output of the charging circuit switch control signal 130 is stopped, the injection of current to the base of the NPN transistor 122 is also stopped, and thus the NPN transistor 122 is non-energized.

In addition, a configuration in which a backflow prevention diode 123 with the direction of the output terminal 100 as the forward direction is provided between the charging circuit switch 120 and the output terminal 100 is also considered. This serves to prevent a current from flowing from the load power supply V to the charging circuit 110 and the charging circuit 110 from failing. In addition, in a case where the load 60 is normally connected, a voltage lower than the load power supply V is used as the charging voltage Vcharge of the charging circuit 110 in order to prevent a current from flowing from the charging circuit 110 to the load power supply V. In the present example, the charging circuit switch 120 can be controlled by the arithmetic device 1, but another controller may be provided instead of the arithmetic device 1.

Figure 5:
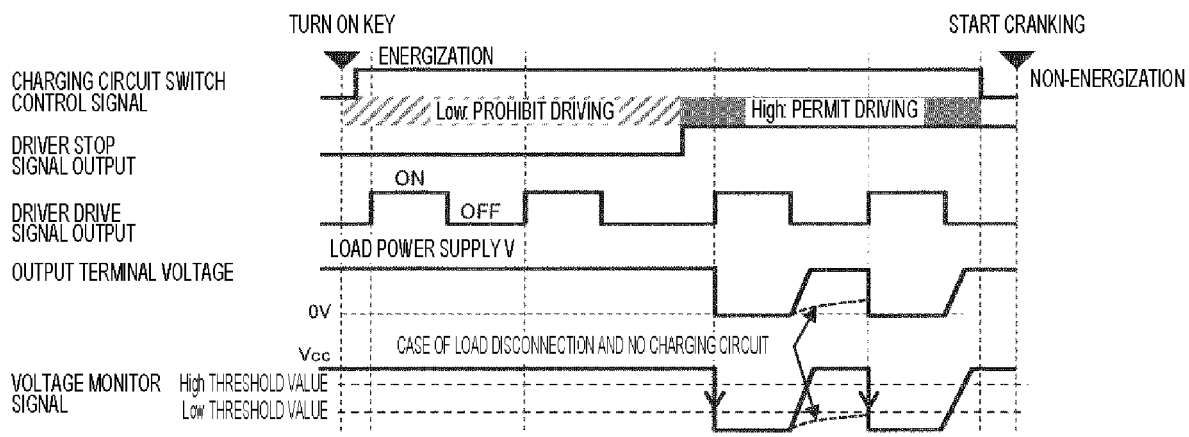
FIG. 5 is a timing chart illustrating an operation example of the load driving device according to the first example of the present invention.

FIG. 5 illustrates an example of a timing chart of abnormality diagnosis of the driver stop mechanism 30 in the present example. When the reference power supply is turned on by turning ON the vehicle key, the arithmetic device 1 and the driver stop mechanism 30 can be controlled after a certain startup period.

The arithmetic device 1 outputs the charging circuit switch control signal 130 to energize the charging circuit switch 120. At the time of energization, since the low side driver 50 is non-energized, the voltage monitor signal becomes the Vcc voltage.

Next, in order to confirm that the driver stop mechanism 30 can normally prohibit driving, the driver stop mechanism 30 outputs a drive prohibiting signal to the driver control circuit 20 for a predetermined period. Meanwhile, the arithmetic device 1 outputs a predetermined number of drive signals to the driver control circuit 20, and counts the number of times of voltage variation of the voltage monitor signal.

Thereafter, in order to confirm that the driver stop mechanism 30 can normally permit driving, the driver stop mechanism 30 outputs a drive permitting signal to the driver control circuit 20. Meanwhile, the arithmetic device 1 outputs a predetermined number of drive signals to the driver control circuit 20, and counts the number of times of voltage variation of the voltage monitor signal.

After the above diagnosis is finished, the arithmetic device 1 non-energizes the charging circuit switch 120 through the charging circuit switch control signal line 130.

Thereafter, when the driver stop mechanism 30 is normal in the above diagnosis result, the arithmetic device 1 permits the start of cranking, and stops the cranking in the case of abnormality, and notifies the user of the abnormality.

In the present example, the arithmetic device 1 diagnoses that the driver stop mechanism 30 is normal by detecting that there is no voltage variation greater than or equal to the predetermined threshold value in the voltage monitor signal in the drive prohibiting signal output period and that there is a voltage variation corresponding to the number of times of transmission of the driver drive signal in the voltage monitor signal in the drive permitting signal output period.

In the diagnosis of the driver stop mechanism 30 according to the circuit configuration of the conventional load driving device illustrated in FIG. 2, since there is no charging circuit 110, when the low side driver 50 is non-energized from being energized at the time of disconnection of the load 60, it takes time to charge the terminal capacitor 70, and the voltage of the output terminal 100 is blunted. Then, the low side driver 50 is energized before the voltage monitor signal becomes greater than or equal to the predetermined High threshold value, and the arithmetic device 1 cannot count the voltage variation for the predetermined number of times. Then, even if the driver stop mechanism 30 can normally permit driving of the driver, the arithmetic device 1 determines that there is an abnormality.

On the other hand, as illustrated in FIG. 3, by providing the charging circuit 110, the terminal capacitor 70 can be quickly charged immediately after the low side driver 50 is non-energized from being energized, and the voltage monitor signal can be quickly determined to be High, so that it is possible to detect a voltage variation of a predetermined number of times.

Furthermore, by non-energizing the charging circuit switch 120 after the above diagnosis is finished, it is possible to suppress a current from flowing from the charging circuit 110 to the load power supply V and to suppress a malfunction of another load or the control unit.

Figure 6:
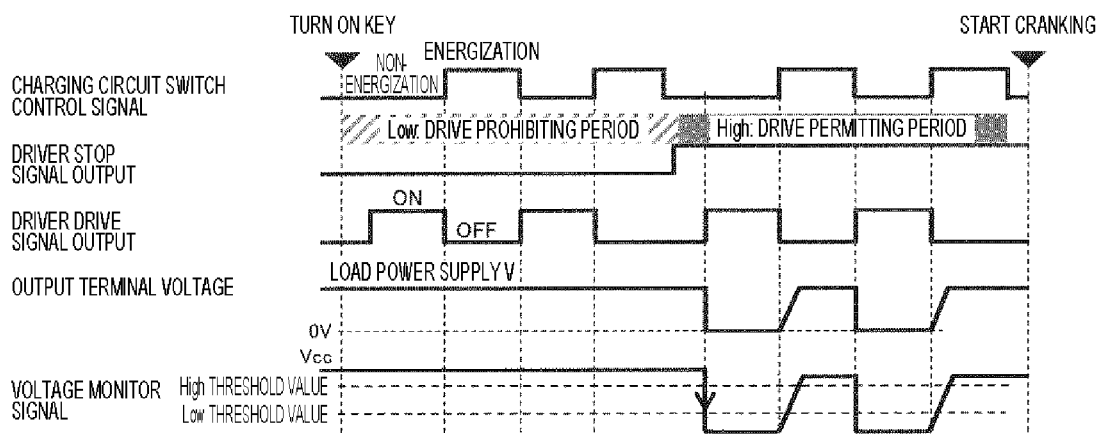
FIG. 6 is a timing chart illustrating another operation example of the load driving device according to the first example of the present invention.

FIG. 6 illustrates energization timing at which the charging circuit switch 120 is turned on when the low side driver 50 is turned off. The arithmetic device 1 outputs an OFF signal to the driver control circuit 20, and controls the charging circuit switch 120 to be energized at a timing when the low side driver 50 becomes non-energized.

When the charging circuit switch 120 is energized at the time the low side driver 50 is energized, the current flowing from the charging circuit 110 flows to the GND through the low side driver 50, which leads to increase in power consumption. Therefore, wasteful power consumption can be suppressed by energizing the charging circuit switch 120 at the timing as illustrated in FIG. 6.

Figure 7:
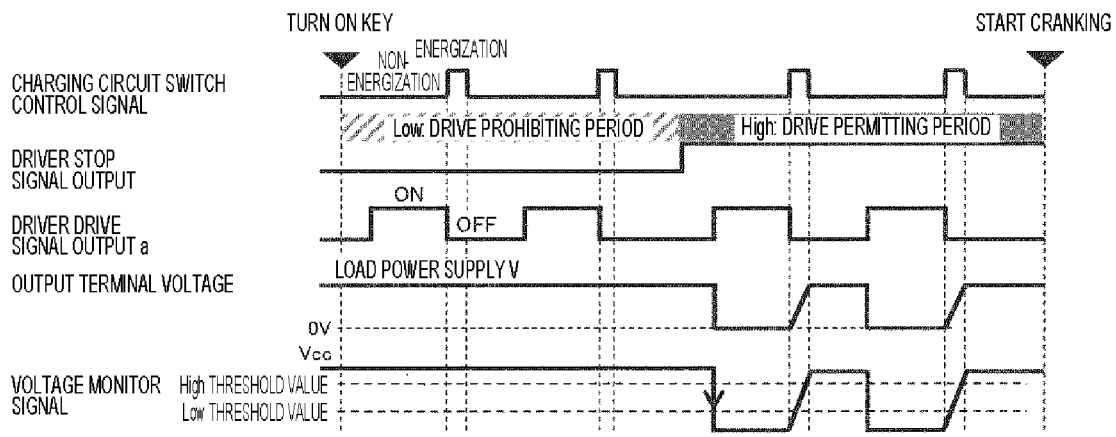
FIG. 7 is a timing chart illustrating another operation example of the load driving device according to the first example of the present invention.

In addition, FIG. 7 illustrates energization timing at which the charging circuit switch 120 is turned OFF after completion of charging of the terminal capacitor 70. The arithmetic device 1 performs control such that the charging circuit switch 120 is energized only for the charging time of the terminal capacitor 70 obtained from the capacitance of the terminal capacitor 70 and the output current of the charging circuit 110. As a result, in addition to reduction in wasteful power consumption similar to the above (FIG. 6), malfunction of other loads and the control unit due to the current of the charging circuit 110 flowing to the upstream of the load power supply is suppressed.

Figure 11:
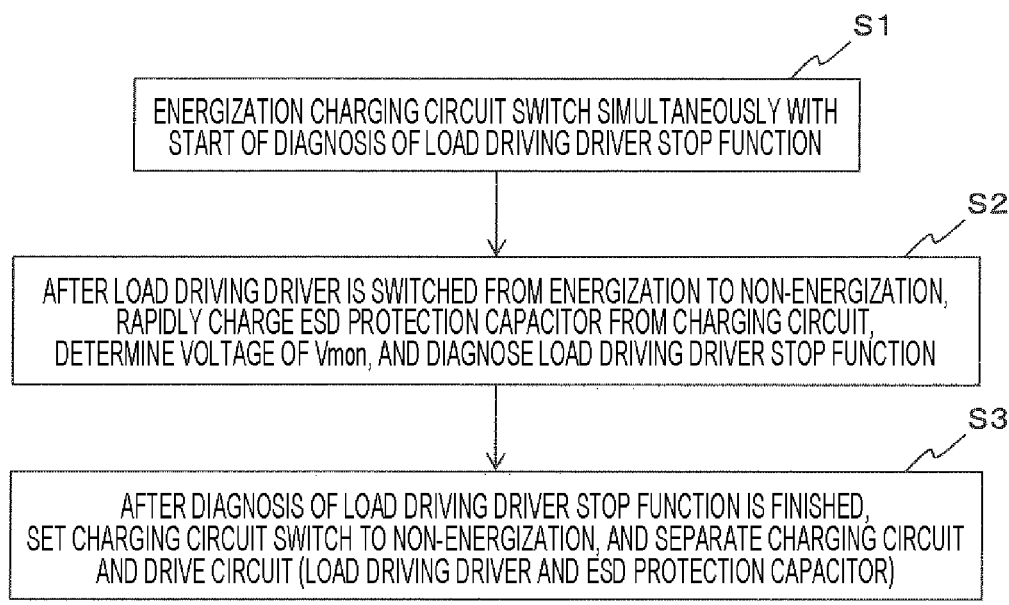
FIG. 11 is a flowchart illustrating a diagnostic method for a representative load driving device of the present invention.

A flowchart of FIG. 11 illustrates a main flow in the diagnostic method for a load driving device of the present example.

First, the charging circuit switch 120 is energized simultaneously with the start of diagnosis of the load-driving driver stop function (driver stop mechanism 30). (Step S1)

Next, after the load driving driver (low side driver 50) is switched from energized to non-energized, the ESD protection capacitor (terminal capacitor 70) is rapidly charged from the charging circuit 110, the voltage of Vmon is determined, and the load driving driver stop function (driver stop mechanism 30) is diagnosed. (Step S2)

Finally, after the diagnosis of the load driving driver stop function (driver stop mechanism 30) is finished, the charging circuit switch 120 is non-energized, and the charging circuit 110 and the drive circuit (load driving driver (low side driver 50) and ESD protection capacitor (terminal capacitor 70)) are separated. (Step S3)

According to the present example, even when the load 60 is disconnected, the diagnosis as to whether the driver stop mechanism can normally operate with respect to the low side driver 50 can be completed within the time between the turning ON of the key and the start of cranking by providing the charging path having a small time constant by the charging circuit 110.

Second Example

Figure 8:
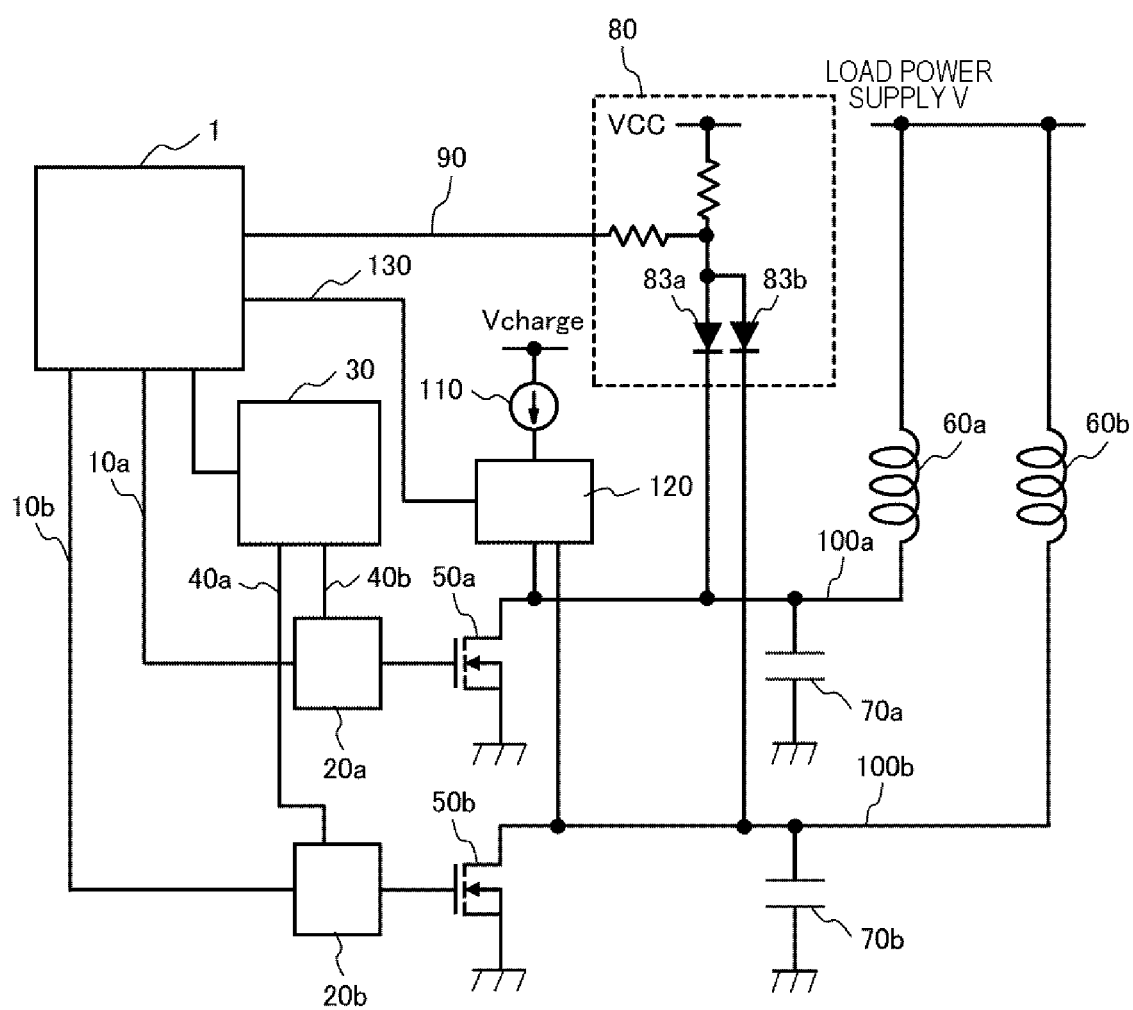
FIG. 8 is a block diagram illustrating a circuit configuration of a load driving device according to a second example of the present invention.
Figure 9:
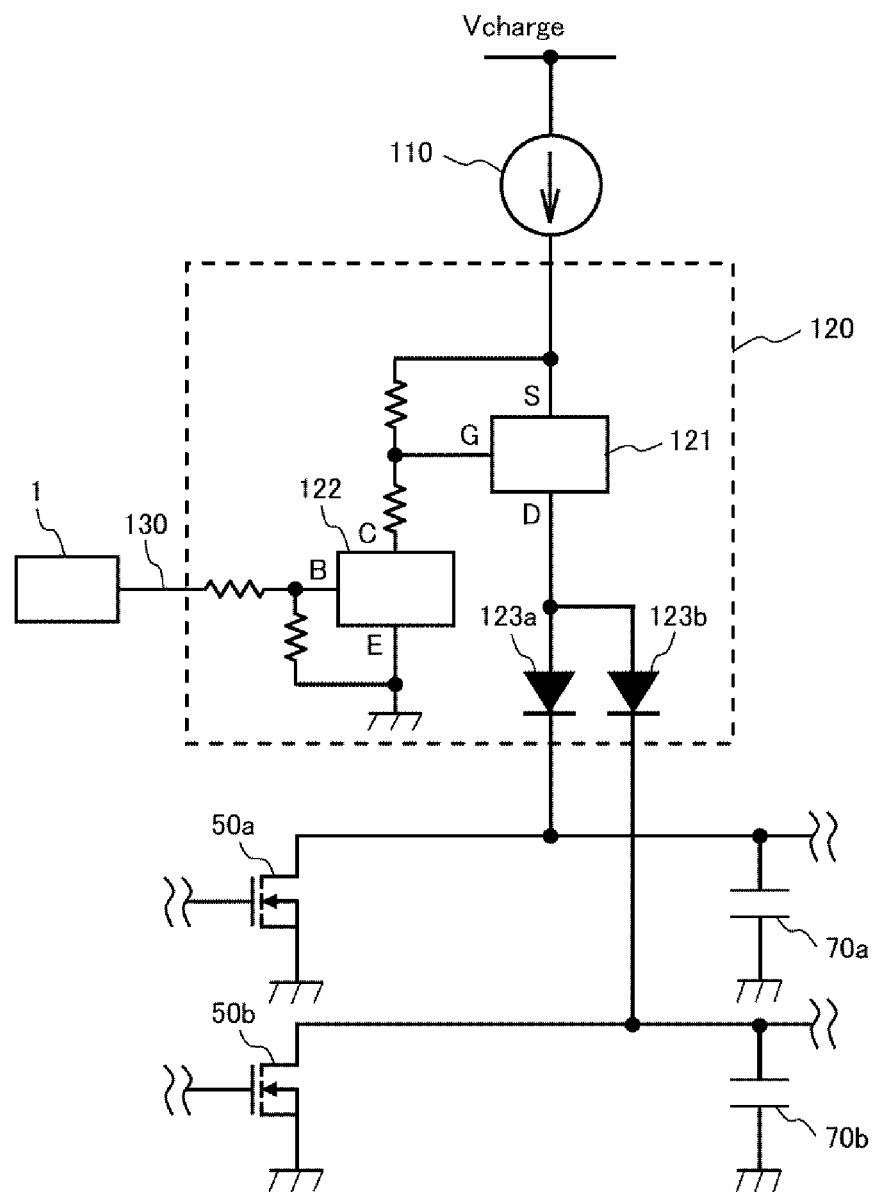
FIG. 9 is a block diagram showing a circuit configuration of the charging circuit switch 120 of FIG. 8.
Figure 10:
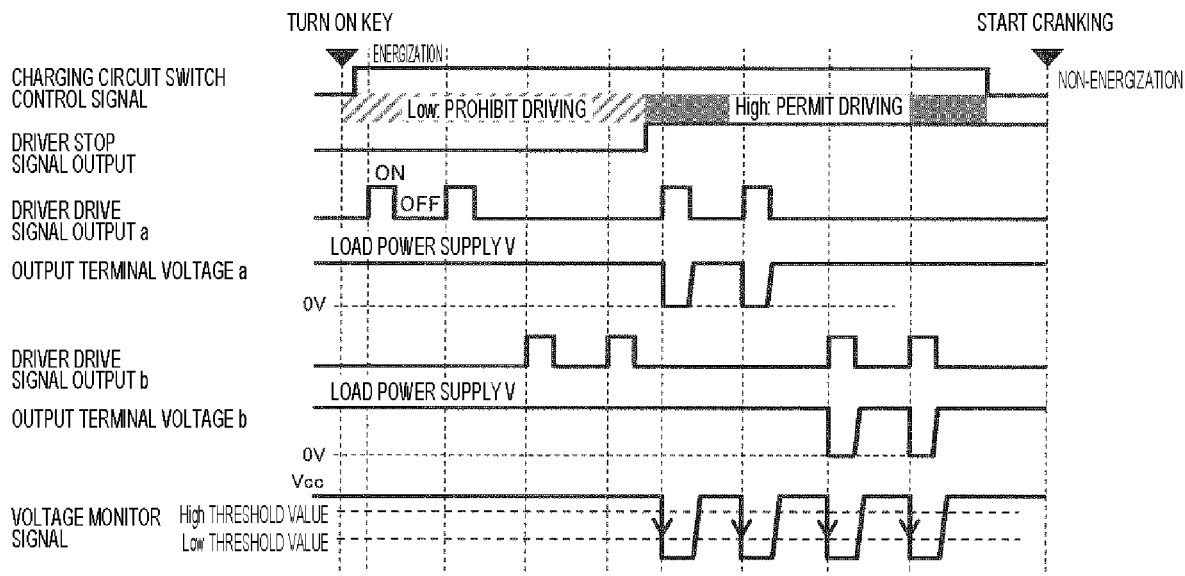
FIG. 10 is a timing chart illustrating an operation example of the load driving device according to the second example of the present invention.

With reference to FIGS. 8 to 10, a load driving device and a diagnostic method thereof according to a second example of the present invention will be described. FIG. 8 is a block diagram illustrating a circuit configuration of the load driving device of the present example. As illustrated in FIGS. 8 and 9, the load driving device of the present example includes a drive circuit and an element corresponding to the first example (FIG. 1) in order to drive a load 60a and a load 60b, respectively. The same reference numerals are denoted on the components common with those of the first example, and the description thereof will be omitted.

As illustrated in FIG. 8, the load driving device of the present example includes a plurality of load driving systems each including loads 60a and 60b, low side drivers 50a and 50b (first switch elements), and terminal capacitors (ESD protection capacitors) 70a and 70b, and has a configuration in which each of the plurality of load driving systems is connected in parallel to each other for one charging circuit 110 and one charging circuit switch 120 (second switch element).

In the present example, as illustrated in FIG. 10, in the diagnosis of the driver stop mechanism 30, the arithmetic device 1 outputs a drive signal to each of the driver control circuits 20a and 20b at the timing when the load 60a and the load 60b are not simultaneously driven. Then, the arithmetic device 1 detects the voltage variation at the timing when each load is driven through the voltage monitor signal line 90.

In the circuit configuration of the present example (FIG. 8), one charging circuit 110 covers charging of the two terminal capacitors 70a and 70b, but a configuration including the charging circuit 110 for the number of terminal capacitors is also conceivable.

In the present example, it is possible to diagnose whether the driver stop function of the loads of the two systems is normally operating with one voltage monitor signal line 90 by controlling the timing of outputting the drive signal from the arithmetic device 1 so that the drives do not overlap with respect to the load 60a and the load 60b. In addition, even in a case where there are two or more loads, it is possible to diagnose the driver stop mechanism 30 by similarly providing a circuit and an element for driving the load.

Note that the charging circuit 110 and the charging circuit switch 120 can be provided to each of the load driving systems.

Note that the present invention is not limited to the examples described above, and includes various modified examples. For example, the examples described above have been described in detail to assist the understanding of the present invention, and are not necessarily limited to those having all the described configurations. In addition, a part of the configuration of a certain embodiment can be replaced with a configuration of another embodiment, and the configuration of a certain embodiment can be added with the configuration of another embodiment. Furthermore, for a part of the configuration of each example, other configurations can be added, deleted, and replaced.

REFERENCE SIGNS LIST 1 arithmetic device
10a, 10b driver drive signal line
20a, 20b driver control circuit
30 driver stop mechanism
40a, 40b driver stop signal line
50a, 50b low side driver
60a, 60b load (inductive load)
70a, 70b terminal capacitor (ESD protection capacitor)
80 voltage monitor circuit
81 current limiting resistor
82 current limiting resistor
83, 83a, 83b protection diode
90 voltage monitor signal line
100, 100a, 100b output terminal
110 charging circuit
120 charging circuit switch
121 Pch-FET
122 NPN transistor 123, 123a, 123b backflow prevention diode
130 charging circuit switch control signal (line).

The invention claimed is:

1. A load driving device of a vehicle comprising:
a load;
a first switch element connected to the load and configured to control driving of the load;
an electro-static discharge (ESD) protection capacitor connected between the load and the first switch element;
a charging circuit connected between the load and the first switch element and configured to charge the ESD protection capacitor;
a second switch element connected between the ESD protection capacitor and the charging circuit;
an arithmetic device that controls energization timings of the first switch element and the second switch element; and
a voltage monitor circuit that monitors an output terminal voltage between the load and the first switch element, converts the output terminal voltage into a voltage readable by the arithmetic device, and outputs the voltage to the arithmetic device, and
wherein the arithmetic device diagnoses that a diagnosis function is normal when a variation amount of an output voltage of the voltage monitor circuit is greater than or equal to a predetermined range in a drive permitting period of a driving stop signal of the first switch element.

2. The load driving device according to claim 1, wherein the second switch element is switched from OFF to ON between turning ON a key of the vehicle and start of cranking.

3. The load driving device according to claim 1, wherein the second switch element is turned ON when the first switch element is turned OFF.

4. The load driving device according to claim 1, wherein the second switch element is turned OFF after charging of the ESD protection capacitor is completed.

5. The load driving device according to claim 1, further comprising a diode that is connected between the load and the charging circuit and in which a direction from the charging circuit to the second switch element is a forward direction, wherein
an output voltage of the charging circuit is lower than a load power supply voltage of the load.

6. The load driving device according to claim 1, wherein the charging circuit supplies a current smaller than a current flowing to the load when the first switch element is energized.

7. The load driving device according to claim 1, wherein the arithmetic device diagnoses that the driving stop signal is normal when the variation amount of the output voltage is equal to or greater than the predetermined range while the driving stop signal is in a drive permission period, and when the variation amount of the output voltage is within a predetermined threshold while the driving stop signal is in a drive prohibition period.

8. The load driving device according to claim 1, further comprising:
the arithmetic device diagnoses that the driving stop signal is not normal and stops cranking of the vehicle when the variation amount of the output voltage is less than the predetermined range in the drive permitting period of the driving stop signal.

9. The load driving device according to claim 1, further comprising a plurality of load driving systems each including the load, the first switch element, and the ESD protection capacitor, wherein
each of the plurality of load driving systems is connected in parallel to each other for one charging circuit and one second switch element.

10. A load driving device comprising:
a plurality of load driving systems each including:
a load,
a first switch element connected to the load and configured to control driving of the load, and
an electro-static discharge (ESD) protection capacitor connected between the load and the first switch element;
a charging circuit connected between the load and the first switch element and configured to charge the ESD protection capacitor; and
a second switch element connected between the ESD protection capacitor and the charging circuit, and
wherein the charging circuit and the second switch element are both connected to the plurality of load driving systems and each of the plurality of load driving systems is connected in parallel to each other.

* * * * *